United States Patent
Kato (10) Patent No.: US 9,478,725 B2
(45) Date of Patent: Oct. 25, 2016

(54) MULTI-LAYER PIEZOELECTRIC ELEMENT, AND INJECTION DEVICE AND FUEL INJECTION SYSTEM PROVIDED WITH THE SAME

(75) Inventor: Takeshi Kato, Kagoshima (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 404 days.

(21) Appl. No.: 14/001,166

(22) PCT Filed: Feb. 24, 2012

(86) PCT No.: PCT/JP2012/054577
§ 371 (c)(1),
(2), (4) Date: Oct. 15, 2013

(87) PCT Pub. No.: WO2012/115230
PCT Pub. Date: Aug. 30, 2012

(65) Prior Publication Data
US 2014/0020659 A1    Jan. 23, 2014

(30) Foreign Application Priority Data

Feb. 24, 2011    (JP) ................................. 2011-038569

(51) Int. Cl.
*H01L 41/047*    (2006.01)
*F02M 51/06*    (2006.01)

(52) U.S. Cl.
CPC ...... *H01L 41/0472* (2013.01); *F02M 51/0603* (2013.01)

(58) Field of Classification Search
CPC .. F02M 51/00; F02M 51/06; F02M 51/0603; F02M 63/02; F02M 63/0225; H01L 41/0471; H01L 41/0472; H01L 41/08; H01L 41/083; H01L 41/0838; H01L 41/122; H01L 41/187; H01L 41/24
USPC ........ 123/456, 472, 478, 490, 498; 310/328, 310/364–366; 239/102.2, 585.1
See application file for complete search history.

(56) References Cited

U.S. PATENT DOCUMENTS

| 4,803,393 A * | 2/1989 | Takahashi ............... F02M 47/02 123/478 |
| 7,205,706 B2 * | 4/2007 | Kadotani ............ H01L 41/0472 310/328 |

(Continued)

FOREIGN PATENT DOCUMENTS

| JP | 63153870 | 6/1988 |
| JP | 2002202024 | 7/2002 |

(Continued)

OTHER PUBLICATIONS

JP 2011003574 English Translation Version.*

(Continued)

*Primary Examiner* — Hung Q Nguyen
*Assistant Examiner* — Johnny H Hoang
(74) *Attorney, Agent, or Firm* — Volpe and Koenig, P.C.

(57) ABSTRACT

There are provided a multi-layer piezoelectric element that is driven stably for a long period of time without developing cracks in a junction between a metallized layer and a lead member or a stacked body, and an injection device and a fuel injection system provided with the same. A multi-layer piezoelectric element includes a stacked body in which piezoelectric layers and internal electrodes are laminated; a metallized layer disposed on a side surface of the stacked body, the metalized layer being electrically connected to the internal electrodes; and an external electrode member disposed on the metallized layer, with an electrically-conductive adhesive layer interposed therebetween, wherein the electrically-conductive adhesive layer has a plurality of voids configured not to open on a surface thereof which surface is in contact with the metallized layer.

12 Claims, 10 Drawing Sheets

(56) References Cited

U.S. PATENT DOCUMENTS

| | | | |
|---|---|---|---|
| 7,633,214 B2* | 12/2009 | Okamura | H01L 41/0477 310/363 |
| 8,201,543 B2* | 6/2012 | Morris | F02M 51/0603 123/494 |
| 8,578,911 B2* | 11/2013 | Nakamura | H01L 41/0472 123/490 |
| 2001/0047796 A1 | 12/2001 | Yamada et al. | |
| 2002/0158552 A1* | 10/2002 | Nakamura | H01L 41/0472 310/328 |
| 2006/0043841 A1 | 3/2006 | Kadotani et al. | |
| 2008/0007144 A1 | 1/2008 | Takei et al. | |
| 2008/0202477 A1* | 8/2008 | Boecking | F02M 51/005 123/498 |
| 2010/0313853 A1* | 12/2010 | Morris | F02M 51/0603 123/472 |
| 2010/0326405 A1* | 12/2010 | Nakamura | H01L 41/0838 123/498 |
| 2011/0155104 A1 | 6/2011 | Nakamura | |

FOREIGN PATENT DOCUMENTS

| | | |
|---|---|---|
| JP | 2011003574 | 1/2011 |
| WO | 2007114002 A1 | 10/2007 |
| WO | 2010013670 A1 | 2/2010 |

OTHER PUBLICATIONS

International Search Report, PCT/JP2012/054577, Mar. 13, 2012, 4 pp.
Chinese Office Action with English concise explanation, Chinese Patent Application No. 201280008822.3, Oct. 29, 2014, 8 pgs.

* cited by examiner

MULTI-LAYER PIEZOELECTRIC ELEMENT, AND INJECTION DEVICE AND FUEL INJECTION SYSTEM PROVIDED WITH THE SAME

FIELD OF INVENTION

The present invention relates to a multi-layer piezoelectric element used for, for example, a piezoelectric driving element (piezoelectric actuator), a pressure sensor element, a piezoelectric circuit element, and so forth, as well as to an injection device and a fuel injection system provided with the multi-layer piezoelectric element.

BACKGROUND

Figure 13:
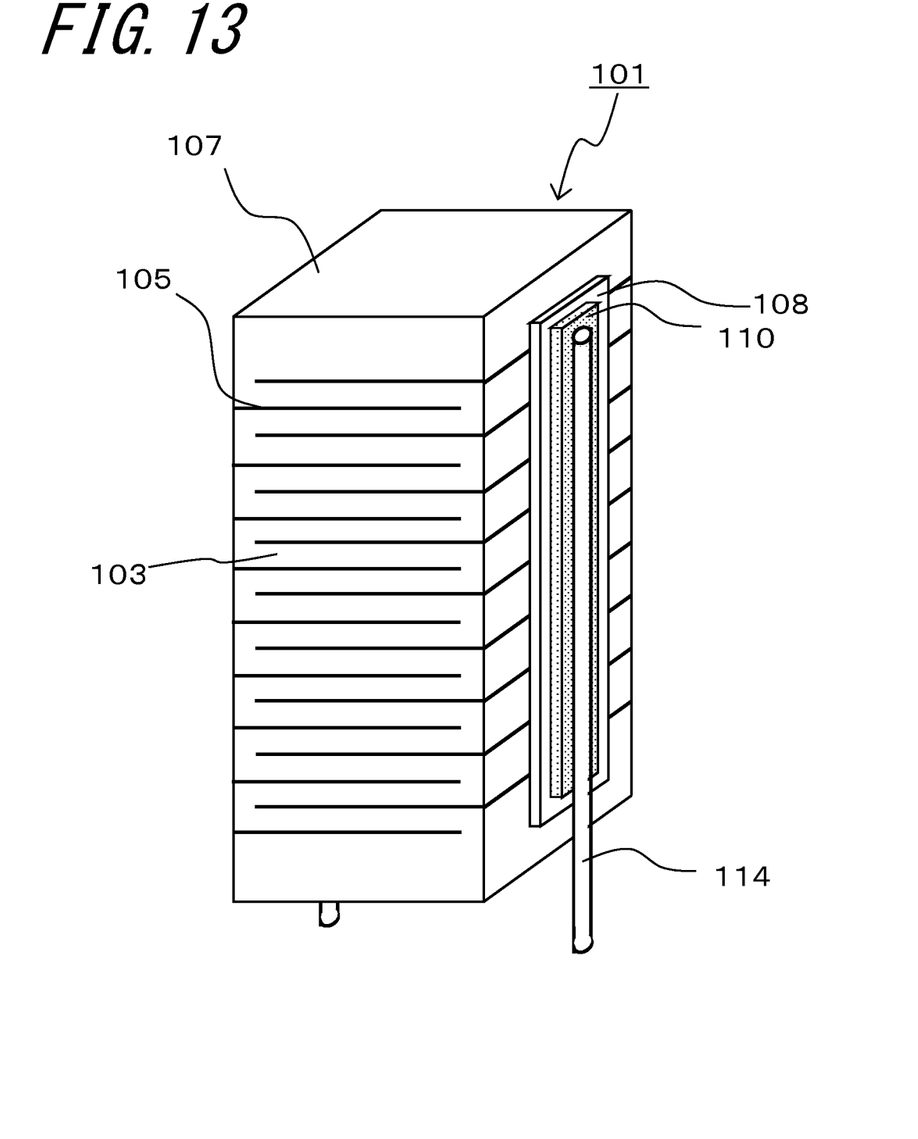
FIG. 13 is a perspective view showing an example of a conventional multi-layer piezoelectric element.

For example, as shown in FIG. 13, there is a conventional multi-layer piezoelectric element which comprises a stacked body 107 which is a lamination of piezoelectric layers 103 and internal electrodes 105, and a metallized layer 108 disposed on a side surface of the stacked body 107 so as to be electrically connected to the internal electrodes 105. In addition, a lead member 114 for application of voltage to the metallized layer is fixedly connected to part of the surface of the metallized layer 108 with use of solder and an electrically-conductive adhesive 110.

CITATION LIST

Patent Literature

Patent Literature 1: Japanese Unexamined Patent Publication JP-A 2002-202024

SUMMARY

However, in the multi-layer piezoelectric element 101 described in Patent Literature 1, when it is used for a fuel injection device (injector) of an automotive internal combustion engine or the like, or equivalently, when it is used under harsh conditions, for example, when driven continuously in the presence of high electric field and high pressure for a long period of time, since a stress concentrates on the boundary of the metallized layer 8 and the electrically-conductive adhesive layer 10, it follows that, a crack may appear in the boundary, which leads to the risk of hindrance to stable driving.

The invention has been devised in view of the problems associated with the related art as mentioned above, and accordingly an object of the invention is to provide a multi-layer piezoelectric element capable of long-term stable driving while suppressing occurrence of cracking in the boundary of the metalized layer and the electrically-conductive adhesive layer, as well as to provide an injection device and a fuel injection system that a provided with the multi-layer peizelectric element.

Solution to Problem

The invention provides a multi-layer piezoelectric element comprising: a stacked body in which piezoelectric layers and internal electrodes are laminated; a metallized layer disposed on a side surface of the stacked body, the metalized layer being electrically connected to the internal electrodes; an external electrode member disposed on the metallized layer, with an electrically-conductive adhesive layer interposed therebetween; wherein the electrically-conductive adhesive layer has a plurality of voids configured not to open on a surface thereof which surface is in contact with the metalized layer.

The invention provides an injection device comprising: a container provided with an injection hole; and the above-described multi-layer piezoelectric element, a fluid stored in the container being injected through the injection hole by driving the multi-layer piezoelectric element.

The invention provides a fuel injection system comprising: a common rail configured to store a high-pressure fuel; the above-described injection device configured to inject the high-pressure fuel stored in the common rail; a pressure pump configured to supply the high-pressure fuel to the common rail; and an injection control unit configured to send driving signals to the injection device.

Advantageous Effects of Invention

According to the multi-layer piezoelectric element of the invention, it is possible to lessen a stress which is concentrated on the boundary of the metalized layer 8 and the electrically-conductive adhesive layer 10 at the time of actuation while maintaining an adequate strength of connection between the metalized layer 8 and the electrically-conductive adhesive layer 10, and thereby with consequent stable laong-term driving.

According to the injection device of the invention, since the multi-layer piezoelectric element can be driven stably for a long period of time, it is possible to perform fluid injection in an intended manner with stability for a long period of time.

According to the fuel injection system of the invention, it is possible to perform injection of high-pressure fuel in an intended manner with stability for a long period of time.

DETAILED DESCRIPTION OF THE PREFERRED EMBODIMENTS

Hereinafter, one embodiment of a multi-layer piezoelectric element pursuant to the invention will be described in detail with reference to the drawings.

Figure 1:
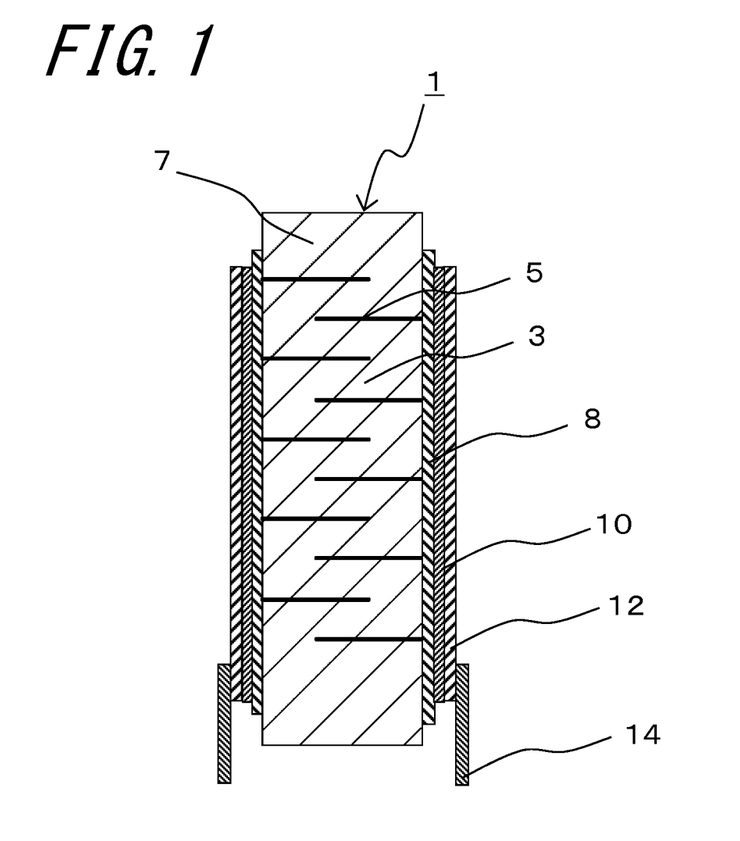
FIG. 1 is a sectional view showing a multi-layer piezoelectric element according to one embodiment of the invention.

FIG. 1 is a sectional view showing a multi-layer piezoelectric element according to one embodiment of the invention, and, as shown in FIG. 1, the multi-layer piezoelectric element 1 of the present embodiment includes: a stacked body 7 in which piezoelectric layers 3 and internal electrodes 5 are laminated; a metallized layer 8 disposed on a side surface of the stacked body 7, the metallized layer 8 being electrically connected to the internal electrodes 5; an external electrode member 12 disposed, through an electrically-conductive adhesive layer 10, on the metallized layer 8; and a lead member 14 bonded to the external electrode member 12.

The stacked body 7 constituting the multi-layer piezoelectric element 1 includes an active section in which the piezoelectric layers 3 and the internal electrodes 5 are alternately laminated, and an inactive section formed of the piezoelectric layers 3 and provided at each end of the active section in a stacking direction of the stacked body, and, the stacked body 7 has a rectangular parallelepiped form which is, for example, 0.5 to 10 mm in length, 0.5 to 10 mm in width, and 1 to 100 mm in height.

The piezoelectric layer 3 constituting the stacked body 7 is made of ceramics having piezoelectric property, and, as such a ceramics, for example, a perovskite-type oxide made of lead zirconate titanate (PbZrO3-PbTiO3), lithium niobate (LiNbO3), and lithium tantalate (LiTaO3) can be used. The piezoelectric layer 3 has a thickness in a range of 3 to 250 μm, for example.

The internal electrodes 5 constituting the stacked body 7, which are formed by means of co-firing together with the ceramics constituting the piezoelectric layers 3, are stacked in alternate relation to the piezoelectric layers 3 in a manner such that one piezoelectric layer 3 is sandwiched between upper-located and lower-located internal electrodes 5, and in which positive electrodes and negative electrodes are arranged according to the stacking order, so that a driving voltage can be applied to the piezoelectric layer 3 sandwiched between the positive and negative electrodes. As the material of construction of the internal electrodes, for example, a conductor composed predominantly of a silver—palladium alloy whose reactivity with piezoelectric ceramics is low, or a conductor containing copper, platinum, or the like can be used. In the case shown in FIG. 1, the positive electrodes and the negative (or grounding) electrodes are led out to opposed side surfaces, taken as a pair, of the stacked body 7 in a staggered arrangement so as to be electrically connected to a pair of metallized layers 8 disposed on the side surface of the stacked body 7. The internal electrode 5 has a thickness in a range of 0.1 to 5 μm, for example.

The paired metallized layers 8 disposed on the side surface of the stacked body 7 for electrical connection with the internal electrode 5 are formed for example by application of a paste made of silver and glass with subsequent baking treatment, and more specifically they are bonded to the side surface of the stacked body 7 so as to be electrically connected to the internal electrodes 3 led out to the opposed side surfaces of the stacked body 7 in a staggered arrangement. The metallized layer 8 has a thickness in a range of 5 to 500 μm, for example.

On the metallized layer 8 is disposed the external electrode member 12 through the electrically-conductive adhesive layer 10. In contrast to the conventional multi-layer piezoelectric element in which the lead member is bonded directly to the metallized layer by the electrically-conductive adhesive, in the multi-layer piezoelectric element 1 of the invention, the external electrode member 12 which is large enough to cover the metallized layer 8 is bonded with use of the electrically-conductive adhesive layer 10.

That is, the electrically-conductive adhesive layer 10 is configured to have an area larger than that of the conventional electrically-conductive adhesive. Accordingly, a stress acting on the metallized layer 8 can be dispersed more effectively than can be done in the conventional case, wherefore development of a crack from the lead-member 14 junction to the stacked body 7 can be restrained.

Exemplary of the electrically-conductive adhesive layer 10 employed herein is a layer made of epoxy resin or polyimide resin containing highly electrically conductive metal powder such as Ag powder or Cu powder. The layer made of such a material is capable of stress relaxation by virtue of its elastic property, and is thus conducive to long-term driving. The electrically-conductive adhesive layer 10 has a thickness in a range of 5 to 500 μm, for example.

Moreover, the external electrode member 12 is a plate-like or metallic mesh-like member made of a metal such as copper, iron, stainless steel, or phosphor bronze, that is larger in width than the lead member 14, and more specifically it has a width in a range of 0.5 to 10 mm and a thickness in a range of 0.01 to 1.0 mm, for example. The external electrode member 12 may be plated with tin or silver to improve the electrical conductivity and thermal conductivity.

Figure 2:
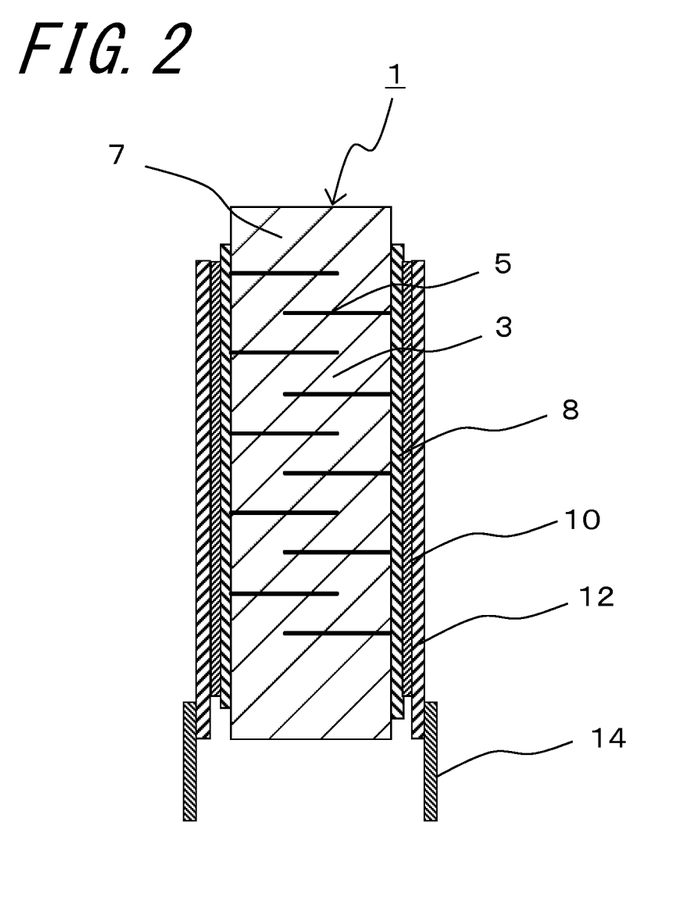
FIG. 2 is a sectional view showing a multi-layer piezoelectric element according to another embodiment of the invention.

Moreover, as shown in FIG. 2, it is preferable that the external electrode member 12 extends outwardly beyond the end surface of the electrically-conductive adhesive layer 10 in the stacking direction, and that the junction between the external electrode member 12 and the lead member 14 is located outside the end surface of the electrically-conductive adhesive layer 10. According to this configuration, since the lead member 14 is bonded to that part of the external electrode member 12 which is not secured by the electrically-conductive adhesive layer 10; that is, a free region of the external electrode member 12, it follows that, even if the lead member 14 moves, a resultant stress will not be applied directly to the stacked body 7, wherefore the multi-layer piezoelectric element 1 can be driven without causing cracking for a longer period of time.

Figure 3:
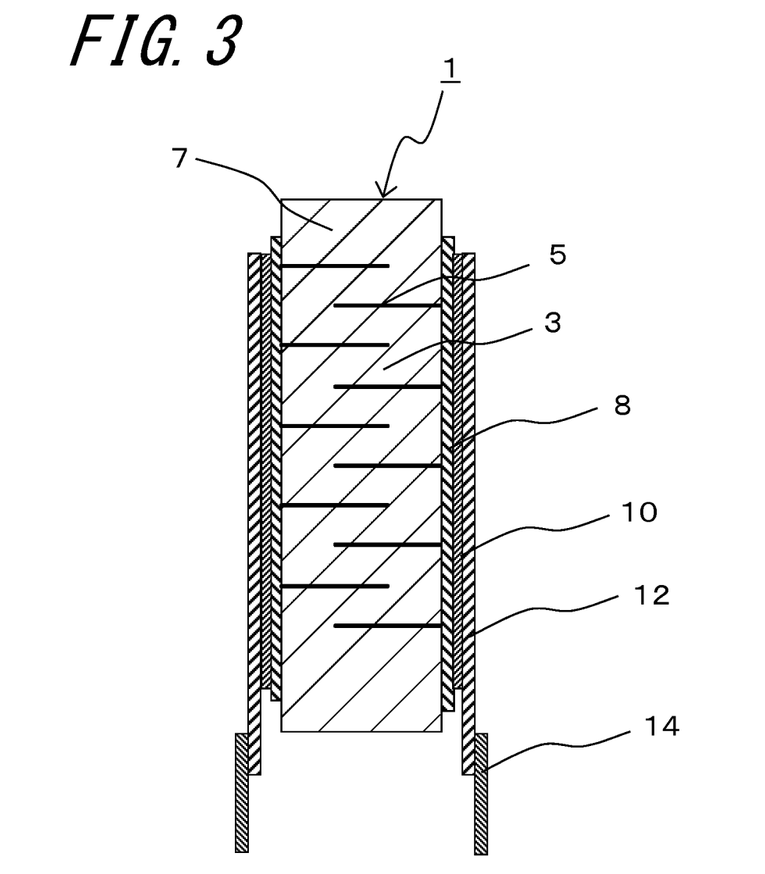
FIG. 3 is a sectional view showing a multi-layer piezoelectric element according to another embodiment of the invention.

Furthermore, as shown in FIG. 3, it is preferable that the external electrode member 12 extends outwardly beyond the end surface of the stacked body 7 in the stacking direction, and that the junction between the external electrode member 12 and the lead member 14 is located outside the end surface of the stacked body 7. According to this configuration, it is possible to suppress application of a stress arising from the movement of the lead member 14 to the stacked body 7 more effectively than can be done in the case shown in FIG. 3, and thereby drive the multi-layer piezoelectric element 1 for an even longer period of time. In the case of using the multi-layer piezoelectric element 1 for automotive applications in particular, although there is the risk of resonance of the multi-layer piezoelectric element 1 with ambient vibration, by placing the junction between the external electrode member 12 and the lead member 14 in a location outside the end surface of the stacked body 7, since the lead member 14 serves as an anti-vibration weight, it is possible to prevent occurrence of resonance and thereby drive the multi-layer piezoelectric element 1 with stability for an even longer period of time.

The multi-layer piezoelectric element 1 includes the lead member 14 bonded to the external electrode member 12. The lead member 14 is intended to establish connection between the external electrode member 12 and an external circuit, and exemplary of the lead member 14 is a pin made of copper, iron, stainless steel, phosphor bronze, or the like. The pin may be plated with tin or silver. Moreover, exemplary of the sectional profile of the pin are a circular shape having a diameter in a range of 100 to 1000 μm and a rectangular shape, one side of which has a length in a range of 200 to 1000 μm. Where the lead member 14 is given the form of a pin, and the axial direction of the lead member 14 is set to coincide with the stacking direction, viz., the driving direction of the multi-layer piezoelectric element 1, then the direction of vibration transmitted to the lead member 14 coincides with the driving direction of the multi-layer piezoelectric element 1 correspondingly, with the result that, even if a connector or the like is bonded to the lead member 14 for use, it never occurs that the connector comes loose due to vibration and that sparking is caused by loose connection.

While the external electrode member 12 and the lead member 14 can be bonded to each other by a bonding method using solder or an electrically-conductive adhesive, a welding technique, and so forth, in the interest of higher resistance to separation and long-term driving capability, the bonding of them should preferably be achieved by means of welding.

According to the construction thus far described, since the electrically-conductive adhesive layer 10 serves as a buffer layer capable of stress relaxation, it never occurs that a crack appears in the junction between the stacked body 7 and the lead member 14 or the external electrode member 12 comes unstuck, wherefore stable long-term driving can be achieved.

Figure 4:
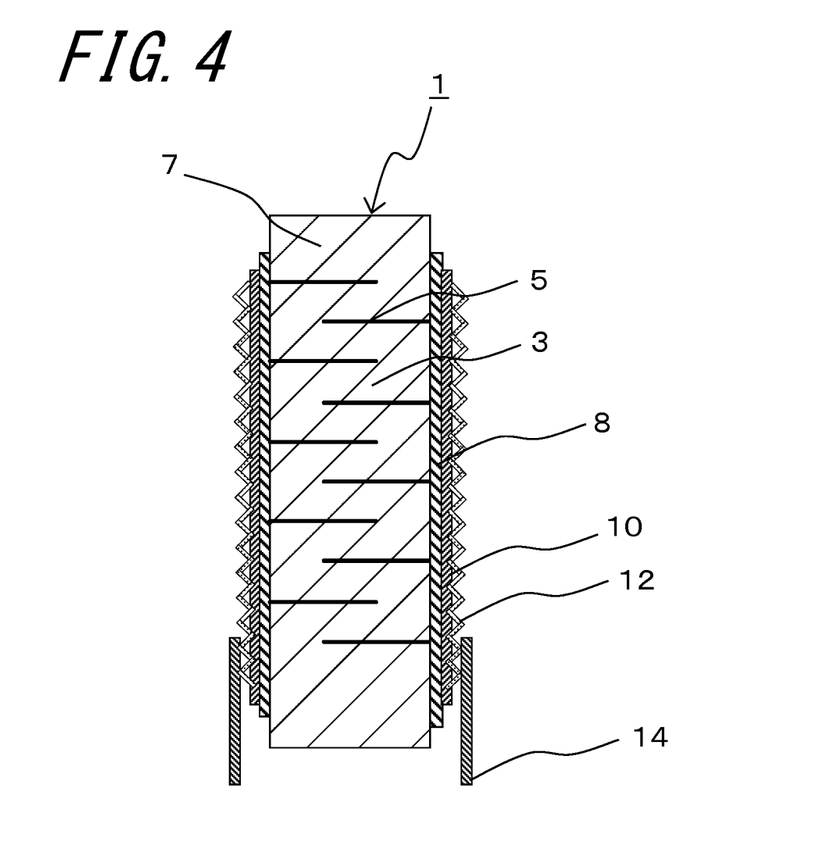
FIG. 4 is a sectional view showing a multi-layer piezoelectric element according to another embodiment of the invention.
Figure 7:
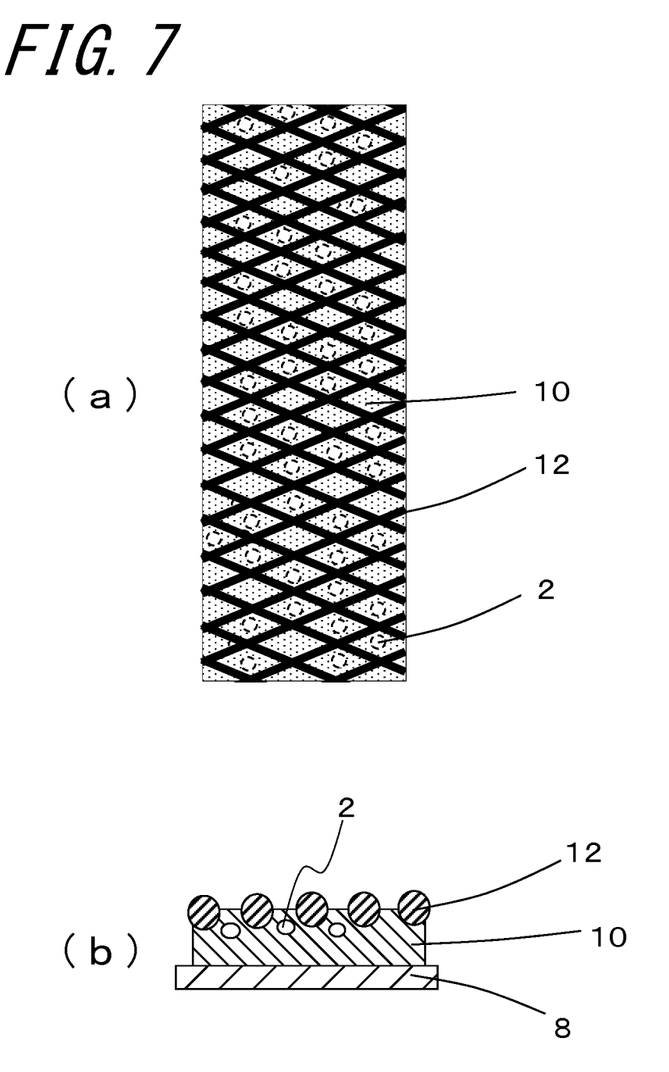
FIG. 7(a) is a partially transparent plan view of a multi-layer piezoelectric element according to another embodiment of the invention.
FIG. 7(b) is an enlarged sectional view of a main part shown in FIG. 7(a)

It is noted that, since the external electrode member 12 has a cubic structure, for example, a corrugated-plate form (having a wave-shaped longitudinal-sectional configuration) as shown in FIG. 4 or a metallic-mesh form (meshed form) made of woven metallic wire rods as shown in FIG. 7, it follows that the electrically-conductive adhesive layer 10 is freely deformable in concert with the driving of the multi-layer piezoelectric element 1, and is thus capable of affording enhanced buffer-layer effect. This makes it possible to achieve stress relaxation, and thereby avoid that a crack appears in the junction between the stacked body 7 and the lead member 14, and that the external electrode member 12 comes unstuck, with consequent stable long-term driving.

Alternatively, the external electrode member 12 may be of a flat-plate member. Where the external electrode member 12 is given the form of a flat plate, the driving direction of the multi-layer piezoelectric element 1 (the direction of extension and contraction of the stacked body 7) can be brought into perfect coincidence with the stacking direction, with the result that the electrically-conductive adhesive layer 10 serves as a buffer layer, and also the driving-axis direction of the multi-layer piezoelectric element 1 undergoes no deflection regardless of the orientation of the lead member 14. That is, in the multi-layer piezoelectric element 1, since abnormal vibration can be avoided by virtue of freedom from deflection arising from actuation, it is possible to avoid that a crack appears in the junction between the stacked body 7 and the lead member 14, and that the external electrode member 12 comes unstuck, with consequent stable long-term driving.

It is preferable that the external electrode member 12 is made of a metal in sheet form, because, so long as being made of a metal sheet, the external electrode member 12 becomes pliable and is thus able to afford greater stress-relaxation effect, which makes it possible to drive the multi-layer piezoelectric element 1 for an even longer period of time. For example, the sheet-like external electrode member 12 is given a thickness in a range of 0.01 to 0.3 mm for effect.

Figure 5:
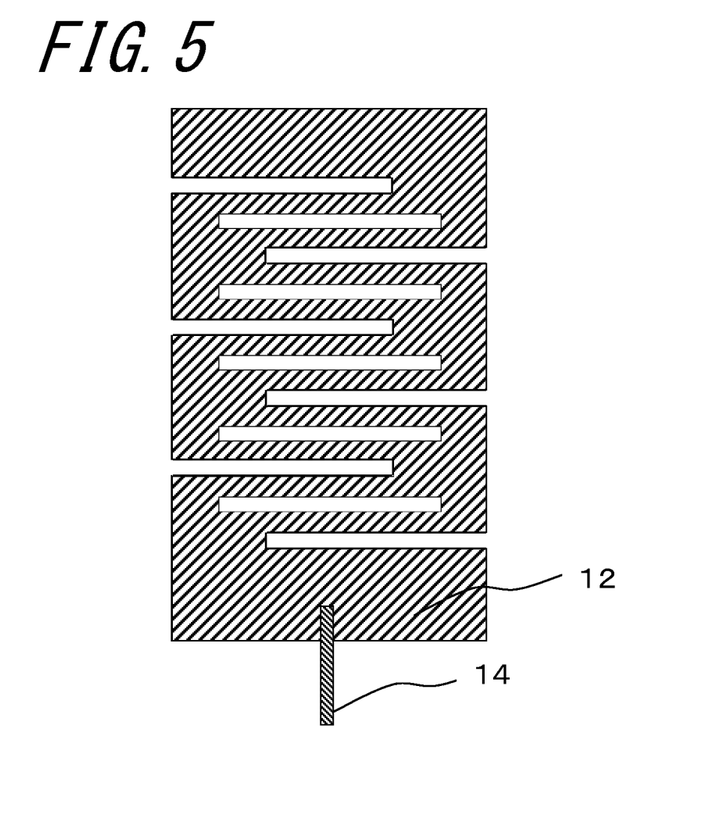
FIG. 5 is a front view showing an example of an external electrode member of the multi-layer piezoelectric element of the invention.

Moreover, as shown in FIG. 5, the external electrode member 12 has slits which are configured to exist alternately from one side surface to the other side surface thereof, and is thus able to afford even greater stress-relaxation effect which is conducive to long-term driving. The width (the dimension in the stacking direction) of the slit falls in a range of 0.01 to 0.3 mm, for example; the length (the dimension in a direction perpendicular to the stacking direction) of the slit is equal to 35 to 95% of the width of the external electrode member 12, for example; and the spacing between the adjacent slits in the stacking direction falls in a range of 0.03 to 0.5 mm, for example.

It is preferable that the external electrode member 12 extends outwardly beyond the end surface of the electrically-conductive adhesive layer 10 in the stacking direction, and that part of the slits is located outside the end surface of the electrically-conductive adhesive layer 10. According to this configuration, since part of the slits exists in a free region which is not secured by the electrically-conductive adhesive layer 10, it follows that the external electrode member 12 is allowed to deform freely at its part near the slit, wherefore stress relaxation can be achieved, with consequent longer-term durability.

It is particularly preferable that the junction between the external electrode member 12 and the lead member 14 is located outside the end surface of the electrically-conductive adhesive layer 10. According to this configuration, since the lead member 14 is bonded to a free region of the external electrode member 12 that is not secured by the electrically-conductive adhesive layer 10, it follows that, even if the lead member 14 moves, a resultant stress will not be applied directly to the stacked body 7, wherefore the multi-layer piezoelectric element 1 can be driven without causing cracking in the stacked body 7 for a longer period of time.

Figure 6:
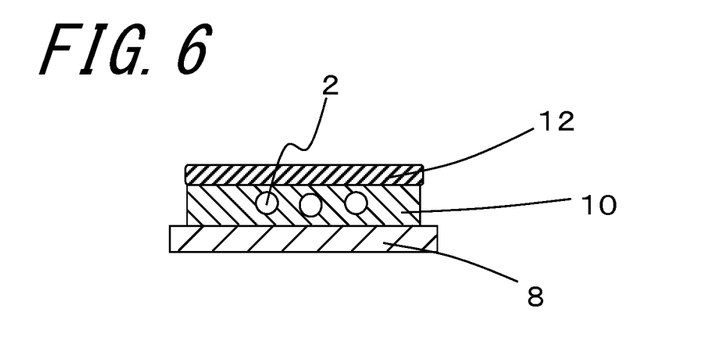
FIG. 6 is an enlarged sectional view showing a main part of a multi-layer piezoelectric element according to another embodiment of the invention.

Meanwhile, as shown in FIG. 6, the electrically-conductive adhesive layer 10 has a plurality of voids 2 configured not to open on the surface thereof which surface is in contact with the metallized layer 8.

The plurality of voids 2 range in diameter from 0.05 to 2 μm, and the diameter value can be derived by observing the section of the electrically-conductive adhesive layer 10 by an electron microscope such as a scanning electron microscope (SEM) or a metallographic microscope to measure the number of voids included in a range defined by given line segments and the lengths of line segments included in the voids, and dividing the sum total of the lengths of the line segments included in the voids by the number of voids. Moreover, in a given section of the electrically-conductive adhesive layer 10, for example, the area of the plurality of voids 2 constitutes 5 to 60% of the area of that section, and this proportion value can also be derived by observing the section by an electron microscope such as a scanning electron microscope (SEM) or a metallographic microscope.

If the plurality of voids 2 open on the surface of the electrically-conductive adhesive layer 10 kept in contact with the metallized layer 8, the area of junction between the metallized layer 8 and the electrically-conductive adhesive layer 10 will be decreased, in consequence whereof there results insufficiency in the strength of connection between them, and also, in this case, the boundary of the metallized layer 8 and the electrically-conductive adhesive layer 10 is left exposed inside the void 2, and a crack tends to arise from this exposed boundary region. As another possibility, if the plurality of voids 2 are formed so as to pass through the electrically-conductive adhesive layer 10, when that part of the metallized layer 8 which faces the void 2 is cracked due to driving, the path of electricity will be blocked, causing generation of heat around the crack, in consequence whereof there results separation of the electrically-conductive adhesive layer 10.

Thus, since the electrically-conductive adhesive layer 10 has a plurality of voids 2 configured not to open on the surface thereof which surface is in contact with the metallized layer 8, it is possible to lessen a stress which is concentrated on the boundary of the metallized layer 8 and the electrically-conductive adhesive layer 10 at the time of actuation while maintaining an adequate strength of connection between the metallized layer 8 and the electrically-conductive adhesive layer 10, and thereby suppress occurrence of cracking in the boundary and an ensuing break.

Moreover, as shown in FIG. 7, it is preferable that the external electrode member 12 is designed as an electrode of meshed structure, and that the respective voids are positioned in corresponding relation to meshes of the external electrode member 12. FIG. 7(*a*) is a partially transparent plan view of the configuration, in which the voids 2 contained within the electrically-conductive adhesive layer 10 as shown in FIG. 7(*b*) are shown in see-through representation. As used herein, the term "mesh" refers to an opening surrounded by wires constituting the net when the external electrode member 12 is viewed from the front. Examples of the shape of the mesh include: a circle which is 3 to 200 μm in diameter; a rectangle which is 3 to 200 μm in side length; and a rhombus which is 5 to 300 μm in major-axis length and 3 to 200 μm in minor-axis length, and, the void positioned in corresponding relation to the mesh is smaller in diameter than the mesh.

According to this configuration, it is possible to facilitate the extension and contraction of the external electrode member 12, as well as to render the extension and contraction uniform, and thereby achieve further relaxation of the stress concentrated on the boundary of the metallized layer 8 and the electrically-conductive adhesive layer 10 at the time of actuation, with consequent longer-term durability.

Moreover, since the external electrode member 12 is made of a metal sheet having a meshed structure, when a stress is concentrated on the boundary of the metallized layer 8 and the electrically-conductive adhesive layer 10 at the time of driving, the external electrode member 12 becomes deformed so as to be partly twisted around the void 2, wherefore stress relaxation can be achieved, with consequent longer-term durability.

Figure 8:
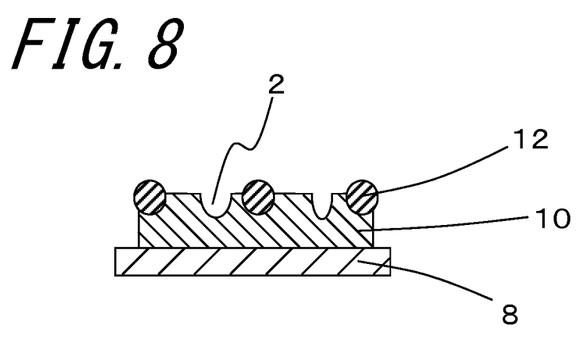
FIG. 8 is an enlarged sectional view showing a main part of a multi-layer piezoelectric element according to another embodiment of the invention.

Moreover, as shown in FIG. 8, it is preferable that the void 2 opens on the surface of the electrically-conductive adhesive layer 10 which surface is in contact with the external electrode member 12. According to this configuration, it is possible to further facilitate the extension and contraction of the external electrode member 12, and thereby achieve further relaxation of the stress concentrated on the boundary of the metallized layer 8 and the electrically-conductive adhesive layer 10 at the time of driving, with consequent even longer-term durability.

Figure 9:
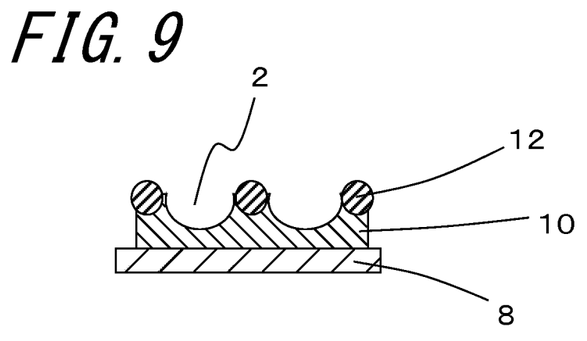
FIG. 9 is an enlarged sectional view showing a main part of a multi-layer piezoelectric element according to another embodiment of the invention.

Moreover, as shown in FIG. 9, it is preferable that openings of the voids 2 have the same size as that of openings of the meshes of the external electrode member 12. According to this configuration, even longer-term durability can be attained. Note that, where the opening of the void 2 has a circular or elliptical shape, whereas the mesh of the external electrode member 12 has a rectangular shape, then, by definition, the opening of the void 2 is given the shape of a circle or ellipse having the maximum permissible dimension insofar as the void 2 can be situated within the range of the contour of the mesh.

Figure 10:
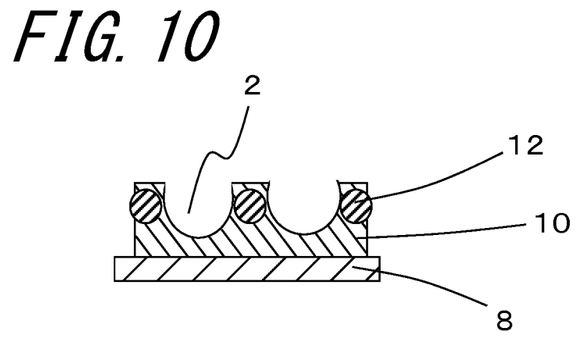
FIG. 10 is an enlarged sectional view showing a main part of a multi-layer piezoelectric element according to another embodiment of the invention.

It is noted that, as shown in FIG. 10, the electrically-conductive adhesive layer 10 is not limited in location to between the metallized layer 8 and the external electrode member 12, but may be formed so as to protrude outwardly of the external electrode member 12.

It is also preferable that the voids 2 are distributed in a location of the electrically-conductive adhesive layer 10 corresponding to the active section of the stacked body 7, in particular, a location of the electrically-conductive adhesive layer 10 corresponding to the midportion of the stacked body 7 in the stacking direction (not shown). As used herein, the term "the midportion of the stacked body 7 in the stacking direction" refers to, out of three equal parts obtained by dividing the stacked body 7 in the stacking direction, the centrally-located part. Since the active section, in particular the midportion, of the stacked body 7 in the stacking direction undergoes extension and contraction to a greater extent, according to this configuration, longer-term durability can be attained.

Alternatively, it is possible to adopt a configuration in which the external electrode member 12 has slits configured to open on its side surface as shown in FIG. 5, and voids are positioned in corresponding relation to their respective slits. Especially in the case where a protuberance of the electrically-conductive adhesive layer 10 containing the void 2 which is equal in dimension to the clearance of the slit is present in the slit, the external electrode member 12 is spurred to deform at its slit opening around the void 2, wherefore stress relaxation can be achieved, with consequent longer-term durability.

Next, a method for manufacturing the multi-layer piezoelectric element 1 of the present embodiment will be described.

The first step is to form ceramic green sheets that constitute the piezoelectric layers 3. More specifically, a ceramic slurry is prepared by mixing calcined powder of piezoelectric ceramics, a binder made of organic high polymer such as acrylic polymer or butyral polymer, and a plasticizer. Then, the ceramic slurry is shaped into ceramic green sheets by tape molding technique such as doctor blade method or calender roll method. The piezoelectric ceramics may be of any type so long as it has piezoelectric property, and, for example, a perovskite-type oxide made of lead zirconate titanate ($PbZrO_3$-$PbTiO_3$) can be used. Moreover, as the plasticizer, dibutyl phthalate (DBP), dioctyl phthalate (DOP), or the like can be used.

Next, an electrically-conductive paste for forming the internal electrodes 5 is prepared. More specifically, the electrically-conductive paste is prepared by admixing a binder and a plasticizer in metal powder of a silver-palladium alloy. This electrically-conductive paste is applied, in an internal-electrode 5 pattern, on the aforementioned ceramic green sheets by means of screen printing. Then, a plurality of ceramic green sheets with the printed electrically-conductive paste are laminated on top of each other, and the laminate is subjected to binder removal treatment at a predetermined temperature with subsequent firing process at a temperature in a range of 900 to 1200° C. In this way, a stacked body 7 having piezoelectric layers 3 and internal electrodes 5 which are alternately laminated can be produced.

It is noted that the way of producing the stacked body 7 is not limited to the method thus far described, and the stacked body 7 can therefore be produced by any given manufacturing method so long as it allows formation of the stacked body 7 which is a lamination of a plurality of piezoelectric layers 3 and internal electrodes 5.

ext, the stacked body 7 obtained by firing is ground into a predetermined shape by means of a surface grinder or otherwise.

After that, the metallized layer 8 is formed by printing a silver/glass-containing electrically-conductive paste, which is prepared by adding a binder, a plasticizer, and a solvent to a mixture of electrically-conductive particles composed predominantly of silver and glass, in metallized-layer 8 pattern, to the side surface of the stacked body 7 by means of screen printing or otherwise, drying the applied paste, and baking the dried product at a temperature in a range of 650 to 750° C.

Next, the external electrode member 12 is fixedly bonded to the surface of the metallized layer 8, with the electrically-conductive adhesive layer 10 interposed between them.

An adhesive made of epoxy resin or polyimide resin containing highly electrically conductive metal powder such as silver powder or copper powder can be used for the electrically-conductive adhesive layer 10. Moreover, the electrically-conductive adhesive layer 10 can be formed while being adjusted to have predetermined thickness and width by means of screen printing, dispensing, or otherwise.

Formation of the voids 2 in the electrically-conductive adhesive layer 10 can be achieved by using an adhesive blended with a polymeric filler which lends itself to void formation because it can be melted under heat liberated by the drying of the adhesive, for example, an acrylic-, polyethylene-, or natural rubber-based filler in the form of beads.

More specifically, as a method of disposing a plurality of voids 2 in the electrically-conductive adhesive layer 10 so as not to open on the surface thereof which surface is in contact with the metallized layer 8, for example, it is advisable to apply an adhesive in two times. In this case, a polymeric filler-free adhesive is applied as a first, or lower layer, with subsequent appropriate drying treatment. Thereby, no opening will be created at the surface of the electrically-conductive adhesive layer which surface is in contact with the metallized layer. Then, an adhesive blended with a polymeric filler is applied on the lower layer with subsequent appropriate drying treatment, so that voids can be created as intended. Moreover, the polymeric filler may either be blended in a predetermined amount in advance or be put in intended positions afterwards by means of screen printing or dispensing.

For example, where the configuration shown in FIG. 7 is concerned, for example, after the application of a polymeric filler-free adhesive, a polymeric filler alone is screen-printed thereon accurately with use of a meshed screen with void 2-forming positions set therein, and an adhesive is applied thereon. Then, the external electrode member 12 is placed while being positioned precisely.

Moreover, where the configurations shown in FIGS. 8 and 9 are concerned, for example, after the application of a polymeric filler-free adhesive, the external electrode member 12 is placed thereon while being positioned precisely, and a polymeric filler alone is dispensed thereon accurately from above.

Furthermore, where the configuration shown in FIG. 10 is concerned, for example, after the application of a polymeric filler-free adhesive, the external electrode member 12 is placed thereon while being positioned precisely, and a polymeric filler alone is dispensed thereon accurately from above, whereafter an adhesive is further applied to intended regions by a dispenser.

Then, the lead member 14 is bonded to the external electrode member 12 by means of welding, or by solder or an electrically-conductive adhesive. In the case of adopting welding technique, resistance welding is desirable, and, in the case of using solder, solder foil or a solder paste is desirable. At this time, if the multi-layer piezoelectric element 1 as a whole is heated, the state of polarization of the piezoelectric layers 3 will be changed, and it is therefore preferable to effect localized heating by means of laser or otherwise so that the junction alone can be subjected to heat.

Subsequently, a DC electric field of 0.1 to 3 kV/mm is applied to the external electrode members 12 connected to their respective paired metallized layers 8 to initiate polarization in the piezoelectric layers 3 constituting the stacked body 7, whereby the multi-layer piezoelectric element 1 can be completed. In this multi-layer piezoelectric element 1, the metallized layer 8 and an external power source are connected to each other via the external electrode member 12 for application of voltage to the piezoelectric layers 3, so that each of the piezoelectric layers 3 can undergo significant displacement under an inverse piezoelectric effect. Thus, for example, the multi-layer piezoelectric element can be operated as an automotive fuel injection valve capable of supplying a jet of fuel into an engine.

Figure 11:
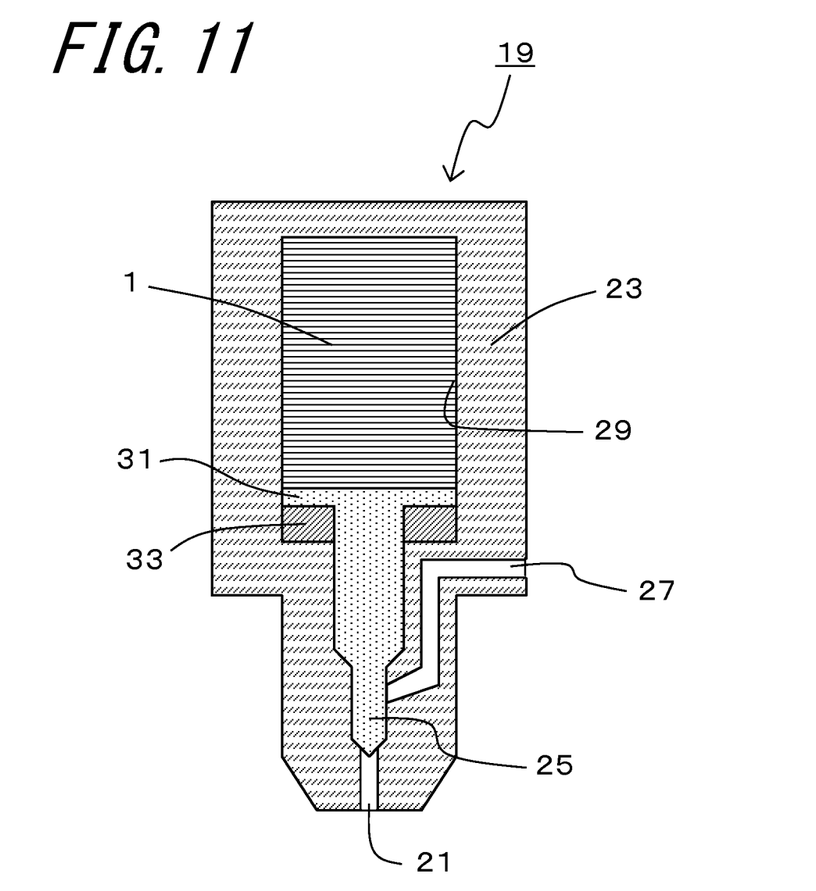
FIG. 11 is a schematic sectional view showing an injection device according to an embodiment of the invention.

Next, an injection device in accordance with the embodiment of the invention will be described. FIG. 11 is a schematic sectional view showing an injection device according to an embodiment of the invention.

As shown in FIG. 11, the injection device 19 of this embodiment includes a housing (container) 23 provided with an injection hole 21 at one end thereof and the multi-layer piezoelectric element 1 of the foregoing embodiment in the housing 23.

In an interior of the housing 23 is disposed a needle valve 25 capable of opening and closing of the injection hole 21. A fluid passage 27 is so disposed as to be capable of communicating with the injection hole 21 in accordance with the movement of the needle valve 25. The fluid passage 27 is coupled to an external fluid supply source, so that a fluid is supplied to the fluid passage 27 under high pressure at all times. Therefore, when the needle valve 25 is operated to open the injection hole 21, then a fluid which has been fed through the fluid passage 27 is injected to the outside or into an adjacent container, for example, a fuel chamber of an internal combustion engine (not shown).

An upper end of the needle valve 25 is a piston 31 which has an increased inner diameter and can slide along a cylinder 65 provided in the housing 23. Furthermore, the above-described multi-layer piezoelectric element 1 is placed within the housing 23 in contact with the piston 31.

In the injection device 19 thus constructed, upon extension of the multi-layer piezoelectric element 1 entailed by application of voltage, the piston 31 is pushed forward, thus causing the needle valve 25 to close the fluid passage 27 communicating with the injection hole 21 with a consequent halt on supply of fluid. Further, upon stopping the application of voltage, the multi-layer piezoelectric element 1 is contracted, and a disc spring 33 pushes the piston 31 backward. In consequence, the fluid passage 27 is opened and the injection hole 21 communicates with the fluid passage 27 so that injection of fluid through the injection hole 21 is carried out.

It is noted that the injection device may be so configured that the fluid passage 27 is opened by applying voltage to the multi-layer piezoelectric element 1, and is contrariwise closed by stopping the application of voltage.

Moreover, the injection device 19 of this embodiment may be so configured to include the housing 23 provided with the injection hole 21 and the multi-layer piezoelectric element 1 of the foregoing embodiment, wherein a fluid stored in the housing 23 is injected through the injection hole 21 by driving the multi-layer piezoelectric element 1. That is, the multi-layer piezoelectric element 1 does not necessarily have to be housed inside the housing 23, and it is thus sufficient that a pressure for the control of fluid injection can be applied to the interior of the housing 23 by driving the multi-layer piezoelectric element 1. In the injection device 19 of this embodiment, the term "fluid" is construed as encompassing not only fuel and ink, but also various matters in liquid form including an electrically-conductive paste and various matters in gaseous form. The use of the injection device 19 of this embodiment makes it possible to control the flow rate of fluid and the timing of fluid injection with stability for a long period of time.

In the case of using the injection device 19 of this embodiment employing the multi-layer piezoelectric element 1 of the foregoing embodiment for an internal combustion engine, as compared to the case of using an injection device of conventional design, a fuel can be injected into a combustion chamber of the internal combustion engine or the like with higher accuracy for a longer period of time.

Figure 12:
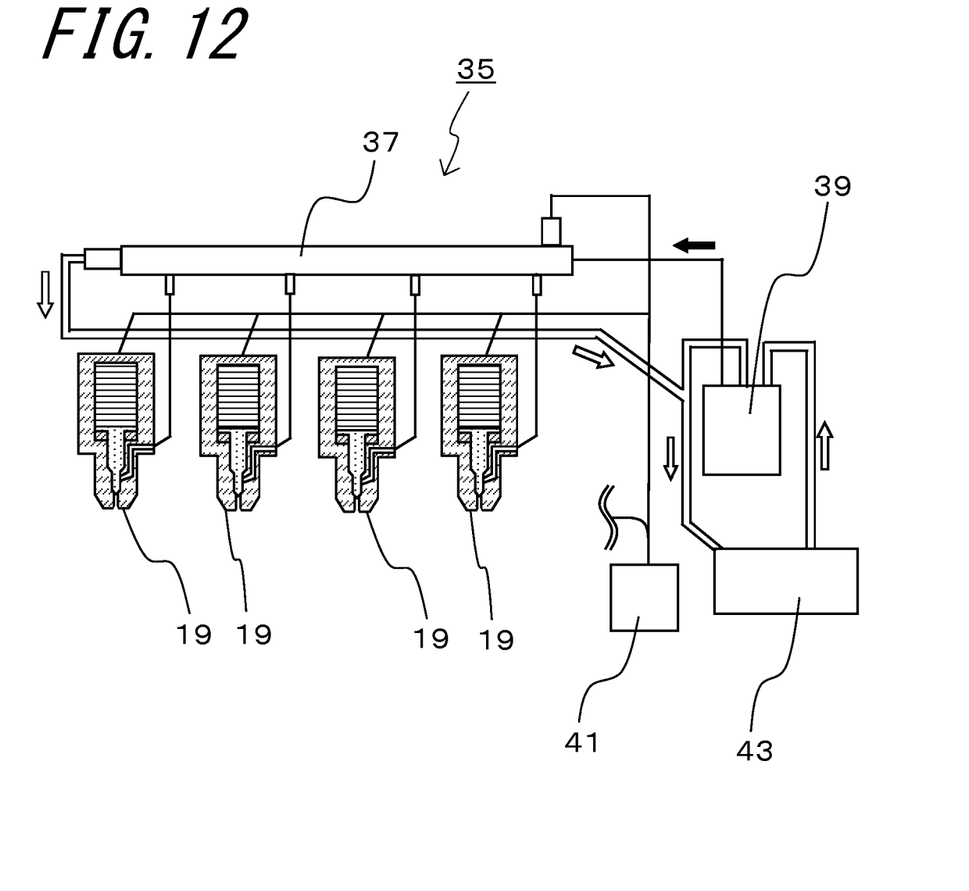
FIG. 12 is a schematic diagram showing a fuel injection system according to an embodiment of the invention.

Next, a fuel injection system in accordance with the embodiment of the invention will be described. FIG. 12 is a schematic diagram showing a fuel injection system according to an embodiment of the invention.

As shown in FIG. 12, the fuel injection system 35 of this embodiment includes a common rail 37 configured to store a high-pressure fuel which is a high-pressure fluid; a plurality of injection devices 19 of the foregoing embodiment, each of which is configured to inject the high-pressure fluid stored in the common rail 37; a pressure pump 39 configured to supply the high-pressure fluid to the common rail 37; and an injection control unit 41 configured to send drive signals to the injection devices 19.

The injection control unit 41 controls the amount of injection of the high-pressure fluid and injection timing on the basis of external information or external signals. For example, where the injection control unit 41 is used for fuel injection into an engine, it is possible to control the amount of fuel injection and injection timing while detecting the conditions of the interior of the combustion chamber of the engine by means of a sensor or otherwise. The pressure pump 39 acts to feed a fluid fuel to the common rail 37 from a fuel tank 43 under high pressure. For example, in the fuel injection system 35 for use in engine application, the fluid fuel is fed to the common rail 37 under a pressure of as high as about 1000 to 2000 atmospheres (about 101 MPa to about 203 MPa), preferably a pressure of as high as about 1500 to 1700 atmospheres (about 152 MPa to about 172 MPa). The common rail 37 stores the high-pressure fuel which has been fed thereto from the pressure pump 39, and feeds it to the injection device 19 on an as needed basis. As has already been described, the injection device 19 injects a certain amount of fluid to the outside or into an adjacent container through the injection hole 21. For example, where a target of fuel supply by injection is an engine, the injection device injects the high-pressure fuel in a mist form into the combustion chamber of the engine through the injection hole 21.

It should be understood that the application of the invention is not limited to the specific embodiments described heretofore, and that various changes and modifications are possible without departing from the scope of the invention. For example, although, in the embodiments described earlier, a single metallized layer 8 is formed on each of the opposed two side surfaces of the stacked body 7, two metallized layers 8 may be formed on the adjacent side surfaces of the stacked body 7, respectively, or may be formed on one and the same side surface of the stacked body 7. Moreover, in a direction perpendicular to the stacking direction, the stacked body 7 may have, instead of a rectangular sectional profile as practiced in the foregoing embodiments, a polygonal, for example, hexagonal or octagonal sectional profile, a circular sectional profile, or a sectional profile defined by a combination of a straight line and an arc.

For example, the multi-layer piezoelectric element 1 of the embodiment can be used for a piezoelectric driving element (piezoelectric actuator), a pressure sensor element, a piezoelectric circuit element, and so forth. Examples of the driving element include a fuel injection device for an automotive engine, a liquid injection device such as an ink-jet system, a precise positioning device such as an optical device, and an anti-vibration device. Examples of the sensor element include a combustion pressure sensor, a knocking sensor, an acceleration sensor, a load sensor, an ultrasound sensor, a pressure-detecting sensor, and a yaw-rate sensor. Moreover, examples of the circuit element include a piezoelectric gyroscope, a piezoelectric switch, a piezoelectric transformer, and a piezoelectric breaker.

EXAMPLES

Hereinafter, examples of the multi-layer piezoelectric element of the invention will be described.

A piezoelectric actuator equipped with the multi-layer piezoelectric element of the invention was produced in the following manner. To begin with, a ceramic slurry was prepared by mixing calcined powder of piezoelectric ceramic composed predominantly of lead zirconate titanate ($PbZrO_3$-$PbTiO_3$) having an average particle size of 0.4 µm, a binder, and a plasticizer. The ceramic slurry was formed into a 50 µm-thick ceramic green sheet for forming the piezoelectric layer by the doctor blade method. Moreover, an electrically-conductive paste for forming the internal electrode was prepared by adding a binder to a silver—palladium alloy.

Subsequently, the internal electrode-forming electrically-conductive paste was printed to one side of the ceramic green sheet by means of screen printing, and 200 ceramic green sheets with the printed electrically-conductive paste were stacked on top of each other. In addition, with this stack of 200 ceramic green sheets having the printed internal electrode-forming electrically-conductive paste set as a core, a total of 15 ceramic green sheets free of the printed internal electrode-forming electrically-conductive paste was laminated on the top and bottom of the core. Then, the resultant body has been fired at a temperature in a range of 980 to 1100° C. to obtain a stacked body. The thusly obtained stacked body has been ground into a predetermined shape by means of a surface grinder.

Next, an electrically-conductive paste, which has been prepared by mixing silver, glass, and a binder, was printed to part of the side surface of the stacked body where a metallized layer is to be formed, by means of screen printing, with subsequent baking treatment at a temperature of 700° C. In this way, the metallized layer was formed on the side surface of the stacked body.

Next, a 100 μm-thick external electrode member made of a phosphor bronze material was fixedly connected, through a 100 μm-thick electrically-conductive adhesive layer made of a silver-polyimide material, to the metallized layer in parallel to the surface of the stacked body. Note that the external electrode member was so disposed as to extend outwardly beyond the end surface of the electrically-conductive adhesive layer to a point spaced 0.5 mm away from that end surface, and, there were prepared two test samples for use, namely an external electrode member having a total of 150 alternating slits arranged at a spacing of 0.1 mm in the stacking direction so as to extend from one side surface to the other side surface, each of which is 0.8 mm in length and 0.1 mm in width in the stacking direction (Sample No. 1) and an external electrode member free of slits (Sample No. 2).

Then, a lead member was bonded to the extended part of the external electrode member located outside the end surface of the electrically-conductive adhesive layer by means of resistance welding. Note that the lead member was fixed, with its axial direction aligned with the stacking direction, and, the front end of the lead member was situated in a position spaced 1 mm away from the end surface of the electrically-conductive adhesive layer.

In the manner as above described, there were fabricated practical examples of the multi-layer piezoelectric element of the invention (Sample No. 1 and Sample No. 2).

Meanwhile, by way of comparative example, there was fabricated a multi-layer piezoelectric element in which the lead member was bonded directly to the metallized layer by solder without interposition of the electrically-conductive adhesive layer and the external electrode member (Sample No. 3).

In each of the thusly produced multi-layer piezoelectric elements, a DC electric field of 3 kV/mm has been applied to the external electrode member via the lead member for 15 minutes to effect polarization. Then, after application of DC voltage of 160 V to the multi-layer piezoelectric elements, a displacement of 30 μm was obtained in the stacking direction of the stacked body.

Moreover, in order to test the durability of each of the multi-layer piezoelectric elements, they have been driven continuously on a 1×108-cycle basis under application of AC voltage ranging from 0 V to +160 V at a frequency of 150 Hz.

The test result showed that the multi-layer piezoelectric element of the example of the invention (Sample No. 1 and Sample No. 2) was free from cracking at the junction between the stacked body and the lead member even after continuous driving on a 1×108-cycle basis. Moreover, the external electrode member did not come unstuck.

On the other hand, in the multi-layer piezoelectric element of the comparative example (Sample No. 3), microcracks were generated in the lead-member junction, in consequence whereof there resulted sparking in the junction, and eventually the driving came to a halt.

REFERENCE SIGNS LIST

1: Multi-layer piezoelectric element
2: Void
3: Piezoelectric layer
5: Internal electrode
7: Stacked body
8: Metallized layer
10: Electrically-conductive adhesive layer
12: External electrode member
14: Lead member
19: Injection device
21: Injection hole
23: Housing (Container)
25: Needle valve
27: Fluid passage
29: Cylinder
31: Piston
33: Disc spring
35: Fuel injection system
37: Common rail
39: Pressure pump
41: Injection control unit
43: Fuel tank

What is claimed is:

1. A multi-layer piezoelectric element, comprising:
a stacked body in which piezoelectric layers and internal electrodes are laminated;
a metallized layer disposed on a side surface of the stacked body, the metallized layer being electrically connected to the internal electrodes; and
an external electrode member disposed on the metallized layer, with an electrically-conductive adhesive layer interposed therebetween,
wherein the external electrode member is an electrode of meshed structure,
wherein the electrically-conductive adhesive layer has a plurality of voids configured not to open on a surface thereof which surface is in contact with the metallized layer, and
the voids are positioned in corresponding relation to meshes of the external electrode member, and
wherein the electrically-conductive adhesive layer is located between the metallized layer and the external electrode member and protrudes outwardly of the external electrode member.

2. The multi-layer piezoelectric element according to claim 1,
wherein the voids open on a surface of the electrically-conductive adhesive layer which surface is in contact with the external electrode member.

3. The multi-layer piezoelectric element according to claim 2,
wherein openings of the voids have the same size as that of openings of the meshes of the external electrode member.

4. The multi-layer piezoelectric element according to claim 1,
wherein the voids are distributed in a location of the electrically-conductive adhesive layer corresponding to a midportion of the stacked body in a stacking direction thereof.

5. The multi-layer piezoelectric element according to claim 1, wherein the external electrode member is made of a metal in sheet form.

6. The multi-layer piezoelectric element according to claim 5,
wherein the external electrode member has slits which are configured to exist alternately from one side surface to another side surface thereof.

7. The multi-layer piezoelectric element according to claim 1, comprising:
a lead member bonded to the external electrode member.

8. The multi-layer piezoelectric element according to claim 7,
wherein the external electrode member extends outwardly beyond an end surface of the electrically-conductive adhesive layer in a stacking direction of the stacked body, and
wherein a junction between the external electrode member and the lead member is located outside the end surface of the electrically-conductive adhesive layer.

9. The multi-layer piezoelectric element according to claim 7,
wherein the external electrode member extends outwardly beyond an end surface of the stacked body in a stacking direction of the stacked body, and
wherein a junction between the external electrode member and the lead member is located outside the end surface of the stacked body.

10. The multi-layer piezoelectric element according to claim 7,
wherein the external electrode member and the lead member are bonded to each other by means of welding.

11. An injection device, comprising:
a container provided with an injection hole; and
a multi-layer piezoelectric element including
a stacked body in which piezoelectric layers and internal electrodes are laminated;
a metallized layer disposed on a side surface of the stacked body, the metallized layer being electrically connected to the internal electrodes; and
an external electrode member disposed on the metallized layer, with an electrically-conductive adhesive layer interposed therebetween,
the external electrode member being an electrode of meshed structure,
the electrically-conductive adhesive layer having a plurality of voids configured not to open on a surface thereof which surface is in contact with the metallized layer, and the voids being positioned in corresponding relation to meshes of the external electrode member, and
the electrically-conductive adhesive layer being located between the metallized layer and the external electrode member and protruding outwardly of the external electrode member, and
a fluid stored in the container being injected through the injection hole by driving the multi-layer piezoelectric element.

12. A fuel injection system, comprising:
a common rail configured to store a high-pressure fuel;
an injection device configured to inject the high-pressure fuel stored in the common rail, the injection device including
a container provided with an injection hole; and
a multi-layer piezoelectric element including
a stacked body in which piezoelectric layers and internal electrodes are laminated;
a metallized layer disposed on a side surface of the stacked body, the metallized layer being electrically connected to the internal electrodes; and
an external electrode member disposed on the metallized layer, with an electrically-conductive adhesive layer interposed therebetween,
the external electrode member being an electrode of meshed structure,
the electrically-conductive adhesive layer having a plurality of voids configured not to open on a surface thereof which surface is in contact with the metallized layer, and the voids being positioned in corresponding relation to meshes of the external electrode member, and
the electrically-conductive adhesive layer being located between the metallized layer and the external electrode member and protruding outwardly of the external electrode member;
a pressure pump configured to supply the high-pressure fuel to the common rail; and
an injection control unit configured to send driving signals to the injection device.

* * * * *